United States Patent [19]

Sproul

[11] 4,428,812

[45] Jan. 31, 1984

[54] RAPID RATE REACTIVE SPUTTERING OF METALLIC COMPOUNDS

[75] Inventor: William D. Sproul, Palatine, Ill.

[73] Assignee: Borg-Warner Corporation, Chicago, Ill.

[21] Appl. No.: 481,954

[22] Filed: Apr. 4, 1983

[51] Int. Cl.$^3$ .............................................. C23C 15/00
[52] U.S. Cl. ................................. 204/192 R; 204/298
[58] Field of Search ..................................... 204/192 R

[56] References Cited

U.S. PATENT DOCUMENTS

| | | | |
|---|---|---|---|
| 3,607,697 | 9/1971 | Shirn et al. | 204/192 |
| 3,654,110 | 4/1972 | Kraus | 204/192 |
| 3,664,931 | 5/1972 | Gerstenberg | 204/38 A |
| 3,798,145 | 3/1974 | Fournier | 204/192 |
| 3,930,975 | 1/1976 | Siegle et al. | 204/192 |
| 4,006,073 | 2/1977 | Welch | 204/298 |
| 4,046,659 | 9/1977 | Cormia et al. | 204/192 R |
| 4,082,040 | 4/1978 | Yamashina et al. | 101/456 |
| 4,125,446 | 11/1978 | Hartsough et al. | 204/192 P |
| 4,281,030 | 7/1981 | Silfvast | 204/192 R |
| 4,336,119 | 6/1982 | Gillery | 204/192 R |
| 4,379,040 | 4/1983 | Gillery | 204/192 R |

OTHER PUBLICATIONS

Aronson, Chen & Class "Preparation of Titanium Nitride by a Pulsed D.C. Magnetron Reactive Deposition Technique Using the Moving Mode of Deposition", 1980, *Thin Solid Films*, pp. 535–540.

*Primary Examiner*—Arthur P. Demers
*Attorney, Agent, or Firm*—James A. Geppert

[57] ABSTRACT

A method of reactive sputtering of the nitride, oxide or carbide of titanium or similar materials onto a substrate from a target of the pure metal in a chamber utilizing an inert gas, such as argon, wherein the deposition rate of the metallic compound approaches substantially the deposition rate of the pure metal. A reactive gas is introduced into the chamber adjacent to the target at a constant flow and by a rapid pulsing wherein a valve is alternately opened and shut for very short time intervals.

9 Claims, 2 Drawing Figures

RAPID RATE REACTIVE SPUTTERING OF METALLIC COMPOUNDS

BACKGROUND OF THE INVENTION

The present invention relates to the rapid rate reactive sputtering of titanium and like metallic compounds onto a substrate or workpiece. The field of this invention comprises substrate coating by cathodic magnetron sputtering and includes a substrate to be coated, a coating material mounted on a target plate, electrode plates causing gas plasma particles to strike the target to release the coating material, means to control the rate of deposition of the coating material, and means to carry the article to be coated and to expose the desired portions for coating. The prior methods for coating substrates with thin metallic films have been accomplished by vapor deposition, plasma spray processes and cathode sputtering.

Vapor deposition processes to provide a metallic thin film on a workpiece utilize the material to be plated which is heated in a suitable atmosphere, such as in a vacuum or an inert shielding gas, to such an extent that the material evaporates and is deposited as a film on a substrate. Plasma spray processes provide the material to be deposited as a fine-grained powder which is brought into a plasma arc so that the particles melt and are deposited on a substrate.

Cathode sputtering or radio-frequency ionic sputtering involves a target of the material to form the coating in a gas discharge wherein the material is sputtered by ion bombardment; the particles removed from the target being deposited on the substrate. The target becomes the cathode and an anode may be located beneath the substrate. Where a thin film of metallic compounds, such as the oxides, nitrides, carbides and the like, are to be deposited on various substrates, reactive sputtering is used wherein the target consists of the metal for the plating compound and a neutral gas, such as argon, is mixed with a reactive gas such as oxygen, nitrogen or methane. The particles that are dislodged from the target combine with the reactive gas to produce the desired compound which is plated on the substrate or workpiece.

A major problem in the sputtering process is an abrupt decrease in the deposition rate of metallic compound films during the sputtering process in a reactive gas atmosphere. The deposition rate using a reactive gas was found to be 10-20% of the rate for the deposition of pure metal in a neutral gas. A method attempting to increase the deposition rate for reactive sputtering of titanium nitride is by the pulsing of the nitrogen gas, wherein the gas is admitted to the chamber for a pulse of 2 to 3 seconds and then shut off for 2 to 3 seconds. Using this pulsing technique, the nitride film deposition rate was increased to approximately 50 to 70% of the deposition rate of the pure metal. The present invention expands on this pulsing technique to achieve a nitride deposition rate that is substantially 100% of the rate of deposition of the pure metal.

SUMMARY OF THE INVENTION

The present invention comprehends the provision of a novel method for reactive sputtering of metallic compounds on a substrate wherein the deposition rate approaches or equals the deposition rate of the pure metal. To improve the deposition rate, the reactive gas at a constant flow rate is rapidly pulsed at a rate of approximately 0.2–0.5 seconds on and off for admission of the reactive gas to the inert atmosphere in the sputtering chamber.

The present invention also comprehends the provision of a novel method for reactive sputtering wherein the inert gas supplied to the chamber is maintained at a substantially constant pressure during the deposition cycle.

Further objects, features and advantages of the present invention will be better appreciated when the following detailed description of the method thereof is taken in conjunction with the accompanying drawing.

DESCRIPTION OF THE PREFERRED EMBODIMENT

Figure 1:
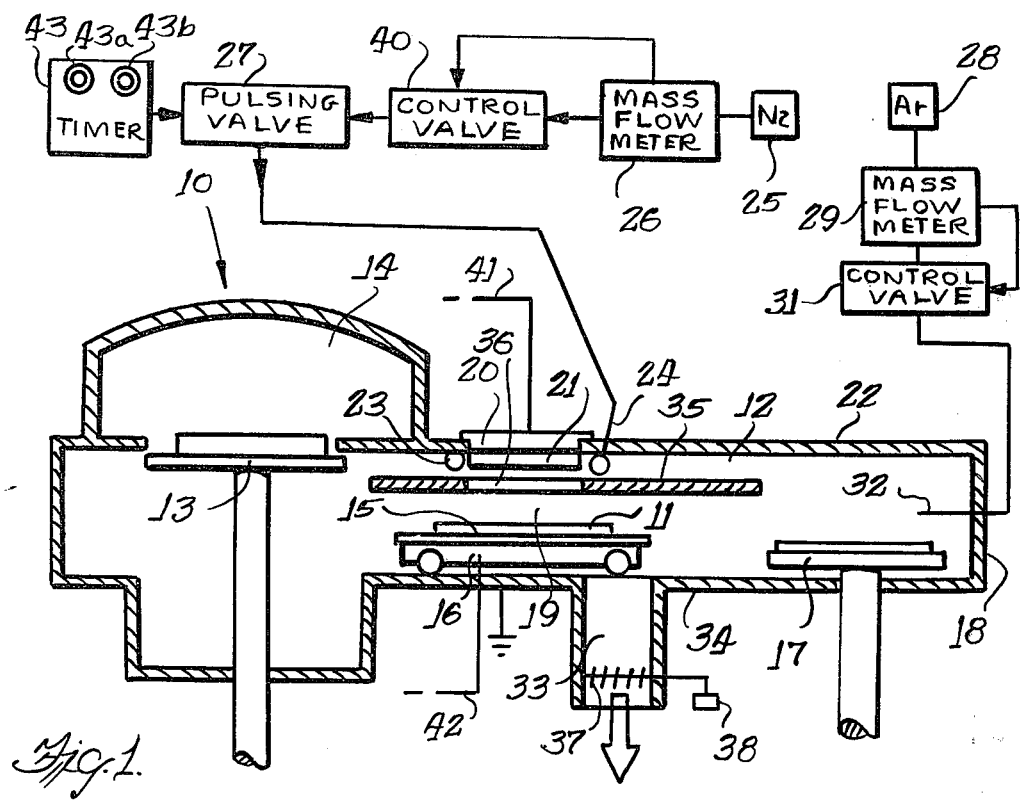
FIG. 1 is a cut-away schematic showing of a sputtering apparatus utilized for the method of the present invention.

Referring more particularly to the disclosure in the drawing wherein is shown in FIG. 1 an illustrative embodiment of reactive sputtering apparatus 10 for the plating of a thin film of titanium nitride (TiN) or the other group IVb metals (zirconium and hafnium) from the periodic table of elements in the form of oxides, nitrides or carbides on a suitable substrate 11. The apparatus includes an elongated chamber 12 having an elevator 13 at one end communicating with a domed loading-/unloading chamber 14, a pallet 15 which is carried by the elevator to receive the substrate 11 to be coated, a pallet carrier 16 receiving the pallet from the elevator and moving the pallet into the chamber 12 for sputtering in the central portion 19 and/or etching on a platform 17 at the end 18 of the chamber opposite to the elevator.

A magnetron cathode 20 carrying the target 21 formed of the group IVb metal, such as titanium, is located in the upper wall 22 of the chamber 12, the target 21 occurring in one of two forms: (1) a generally rectangular block of material to be deposited bonded to the cathode or (2) a generally rectangular ring formed of four blocks of material clamped to the cathode, which is sold under the trademark Inset. A substantially rectangular ring of tubing 23 having a plurality of openings therein directed downwardly and inwardly for a purpose to be later described is positioned encompassing the periphery of the target. A horizontally movable shutter plate 35 having an opening or shutter 36 is positioned below the target 21 to prevent any substantial scattering of material onto other parts of the chamber, thus directing the material onto the substrate below the shutter. The tubing ring 23 is connected to an inlet 24 in the upper wall for communication with a source 25 of a reactive gas, such as nitrogen. The gas source is connected to the inlet 24 through a mass flow meter 26, a control valve 40 which passes a steady flow of the reactive gas in response to a signal from mass flow meter 26, and a pulsing valve 27, which has its on and off times regulated by a timer 43.

A source 28 of an inert gas, such as argon, communicates with an inlet 32 in the chamber end 18 through a mass flow meter 29 and a second control valve 31, which is governed by a control signal from mass flow meter 29. Also, an outlet 33 in the floor 34 of the chamber 12 is connected to a vacuum system for continuous evacuation of the chamber prior to and during etching and sputtering. A throttle 37, similar in form and operation to a metallic venetian blind structure, is positioned in outlet 33 and is regulated by throttle control valve 38.

Vacuum is continuously applied to chamber 12, and the vacuum system draws all air and other contaminants out of the chamber 12 through the outlet 33. To initiate the coating cycle, the elevator 13 is raised with a pallet 15 into the domed chamber 14 wherein a substrate 11 is loaded onto the pallet and the chamber 14 is sealed and vacuum applied. The elevator is lowered and the pallet with the substrate is transferred onto the carrier 16. The empty elevator is raised to seal the domed chamber 14 from main processing chamber 12. Valve 38 is then operated to close throttle 37. Argon gas is then admitted through the flow meter 29, control valve 31, and inlet 32 to the chamber 12 to backfill the chamber with a partial pressure of argon. The carrier 16 moves to the chamber end 18 and deposits the substrate on the etch platform 17. A potential is applied to the substrate and the argon gas ionizes, providing argon ions which bombard the substrate to clean the surface to be coated.

Once cleaned, the potential is interrupted and the carrier 16 returns to pick up the substrate and move it beneath the target 21. The shutter plate 35 is shifted to align the shutter 36 between the target and the substrate. Nitrogen gas is then admitted through inlet 24 and tubing ring 23, and a potential is applied over conductor 41 to the cathode 20, which is in contact with target 21, whereupon argon gas is ionized and the argon ions bombard the titanium target 21. The potential on conductor 41 is a negative 450 to 500 volts. A bias voltage of about minus 100 volts is applied via conductor 42 to the substrate. The titanium atoms pass through the shutter 36, and react with the nitrogen gas from the ring 23 to form titanium nitride on the cleaned substrate 11 and not on the target surface. Deposition may occur in two ways on the substrate. If the substrate is stationary beneath the shutter 36, the titanium nitride deposition will take the general outline of the shutter opening. In the alternative, the substrate may be moved or scanned under the target past the shutter to provide an even deposition of the titanium nitride on the entire surface of the substrate.

Figure 2:
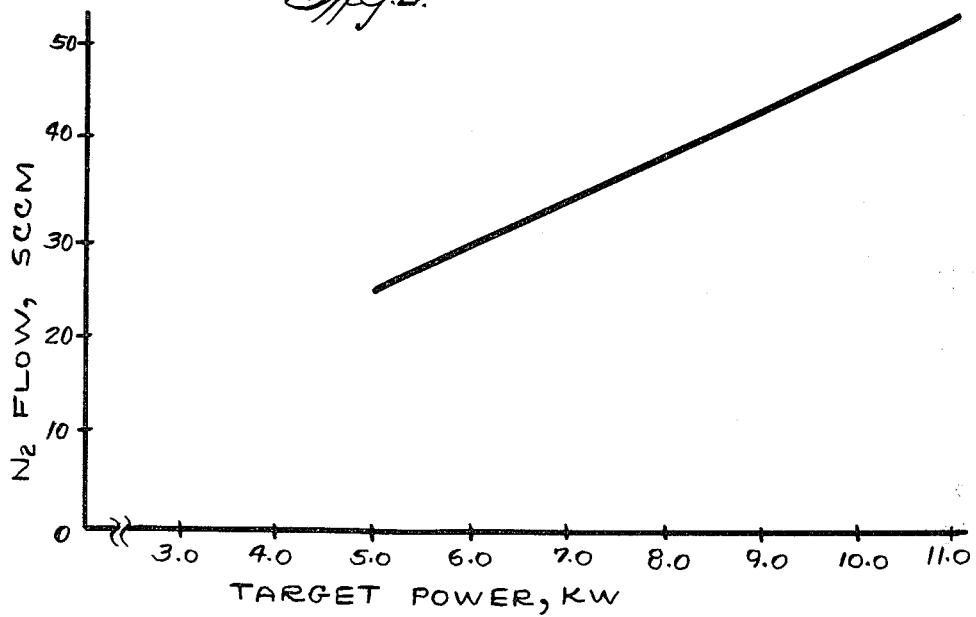
FIG. 2 is a graph showing the power to the metal target versus the flow rate of the reactive gas.

The pressure of the argon gas is manually adjusted to a substantially constant value of 8.0 millitorr, and the power supplied to the target is also adjusted to provide a substantially constant level. As seen in FIG. 2, for the pulsing rate of 0.2 second on and 0.2 second off, the optimum flow of the nitrogen gas will vary with the target power. Thus, at a target power of 5.0 kilowatts, the flow of nitrogen should be 25.4 standard cubic centimeters per minute. Toward the upper end of the scale, a target power of 11 kw requires a nitrogen flow of 53.0 sccm. If a different pulsing rate is utilized, another straight line relationship is established paralleling the line shown in the graph.

To achieve a rate of deposition of titanium nitride that is 90% to substantially 100% of the deposition rate of the pure metal, the nitrogen gas is pulsed at intervals of 0.2 to 0.5 second on and off. The flow of nitrogen through valve 40 was constant, and pulsing of valve 27—that is, setting of the on and off times—was controlled by timer 43, which includes a first control knob 43a to set the "on" time of valve 27 and a second control knob 43b to set the "off" time of this pulsing valve. If the nitrogen gas is admitted for a period of 0.2 second, it is generally shut off for the subsequent 0.2 second time period, but the on and off times need not be equal. This is a duty cycle of 50%, and best results were achieved with on and off times in the range of 0.2 to 0.5 second. Once the desired thickness of the titanium nitride has been achieved, the potential to the target is interrupted and the pallet 15, carrier 16 and substrate 11 are moved back to the elevator 13 so that the coated substrate can be removed through the domed chamber 14. Obviously, with proper entrance and exit chambers at the ends of the sputtering chamber to prevent contamination of the gas during deposition, the batch process enumerated above could be easily transformed into a continuous process for reactive sputtering of numerous substrates or workpieces in a line.

I claim:

1. A process for the effective, rapid rate reactive deposition of a metallic compound from metals in group IVb of the periodic table in a chamber, including the steps of evacuating the chamber and filling with an inert gas, positioning a substrate to be coated in the chamber below a target of the metal to be deposited, admitting into the chamber a second gas adapted to react with the metal of the target, applying a potential to the target to ionize the inert gas and bombard the target with the gas ions to initiate sputtering, and rapidly pulsing the addition of the reactive gas to the chamber.

2. A process as set forth in claim 1, in which said inert gas is retained at a substantially constant pressure.

3. A process as set forth in claim 1, in which said reactive gas is pulsed at an interval of 0.2 to 0.5 second on and 0.2 to 0.5 second off.

4. A process as set forth in claim 3, in which the reactive gas is supplied at a substantially constant flow and the power to the target is retained substantially constant.

5. A process as set forth in claim 1, including interposing a shutter between said target and said substrate.

6. A process as set forth in claim 5, including the step of scanning said substrate beneath said shutter.

7. A process as set forth in claim 1, in which said inert gas is argon and said reactive gas is selected from the group of nitrogen, oxygen and methane.

8. A process as set forth in claim 1, in which said target is formed of titanium and said reactive gas is nitrogen.

9. A process as set forth in claim 3, in which the intervals are adjusted independently of each other.

* * * * *